US011699779B2

(12) United States Patent
Kageyama

(10) Patent No.: US 11,699,779 B2
(45) Date of Patent: Jul. 11, 2023

(54) LIGHT-EMITTING DEVICE

(71) Applicant: NICHIA CORPORATION, Anan (JP)

(72) Inventor: Hiroaki Kageyama, Tokushima (JP)

(73) Assignee: NICHIA CORPORATION, Anan (JP)

( * ) Notice: Subject to any disclaimer, the term of this patent is extended or adjusted under 35 U.S.C. 154(b) by 247 days.

(21) Appl. No.: 17/241,567

(22) Filed: Apr. 27, 2021

(65) Prior Publication Data

US 2021/0336109 A1 Oct. 28, 2021

(30) Foreign Application Priority Data

Apr. 28, 2020 (JP) .................................. 2020-079040
Dec. 4, 2020 (JP) .................................. 2020-201968

(51) Int. Cl.
*H01L 33/62* (2010.01)
*H01L 25/13* (2006.01)

(52) U.S. Cl.
CPC .............. *H01L 33/62* (2013.01); *H01L 25/13* (2013.01)

(58) Field of Classification Search
CPC ......... H01L 33/62; H01L 25/13; H01L 33/64; H01L 25/0753
See application file for complete search history.

(56) References Cited

U.S. PATENT DOCUMENTS

| 2008/0063431 A1* | 3/2008 | Ogihara | B41J 2/45 |
| | | | 257/E33.001 |
| 2010/0133552 A1* | 6/2010 | Cheng | H01L 25/167 |
| | | | 257/E33.056 |
| 2011/0062457 A1* | 3/2011 | Naito | H01L 33/30 |
| | | | 257/E21.04 |
| 2011/0101390 A1 | 5/2011 | Engl et al. | |
| 2012/0113328 A1 | 5/2012 | Takeshima et al. | |
| 2012/0132938 A1* | 5/2012 | Komatsu | H01L 24/97 |
| | | | 257/89 |
| 2012/0138967 A1* | 6/2012 | Shimizu | H01L 25/167 |
| | | | 257/E33.012 |
| 2015/0206922 A1 | 7/2015 | Kawai et al. | |
| 2015/0380610 A1 | 12/2015 | Choy | |

(Continued)

FOREIGN PATENT DOCUMENTS

| CN | 110993777 A | 4/2020 |
| JP | 2003-110148 A | 4/2003 |

(Continued)

*Primary Examiner* — Victor A Mandala
(74) *Attorney, Agent, or Firm* — Foley & Lardner LLP

(57) ABSTRACT

A light-emitting device includes: a substrate; n light-emitting elements (n being a natural number of 2 or more) mounted on the substrate, each comprising a first bonding member electrically connected to a first semiconductor layer, and a second bonding member electrically connected to a second semiconductor layer; and n+1 interconnects provided on the substrate, the n+1 interconnects comprising a first interconnect comprising a first external connection portion, a second interconnect comprising a second external connection portion, and a third interconnect comprising a third external connection portion. In a top-view, the first light-emitting element is located between a first side of the substrate and a second light-emitting element, and the second light-emitting element is located between a first light-emitting element and a second side.

16 Claims, 12 Drawing Sheets

(56) References Cited

U.S. PATENT DOCUMENTS

| | | | |
|---|---|---|---|
| 2017/0154921 A1 | 6/2017 | Kim et al. | |
| 2017/0309801 A1* | 10/2017 | Kawai | H01L 33/507 |
| 2017/0328531 A1 | 11/2017 | Weber et al. | |
| 2017/0365638 A9 | 12/2017 | Kim et al. | |
| 2019/0006326 A1* | 1/2019 | Jiang | H01L 25/167 |
| 2019/0067256 A1* | 2/2019 | Kurimoto | H01L 33/36 |
| 2019/0189853 A1* | 6/2019 | Yoo | H01L 33/385 |
| 2019/0333896 A1 | 10/2019 | Song et al. | |
| 2020/0011518 A1 | 1/2020 | Ko et al. | |
| 2020/0312220 A1* | 10/2020 | Hussell | G09G 3/32 |
| 2021/0043821 A1* | 2/2021 | Hussell | H01L 25/167 |
| 2021/0202800 A1* | 7/2021 | Jung | H01L 25/0753 |
| 2022/0053615 A1* | 2/2022 | Hao | G09G 3/3426 |

FOREIGN PATENT DOCUMENTS

| | | | | |
|---|---|---|---|---|
| JP | 2011-029634 A | | 2/2011 | |
| JP | 2011-044737 A | | 3/2011 | |
| JP | 2011-513957 A | | 4/2011 | |
| JP | 2015-135908 | * | 7/2015 | 33/58 |
| JP | 2015-135908 A | | 7/2015 | |
| JP | 2015-177181 A | | 10/2015 | |
| JP | 2017-195347 A | | 10/2017 | |
| JP | 2017-533587 A | | 11/2017 | |
| JP | 2019-041080 A | | 3/2019 | |
| JP | 2020-057821 A | | 4/2020 | |
| KR | 10-2013-0045686 A | | 5/2013 | |
| KR | 10-2020-0005942 A | | 1/2020 | |
| WO | WO-2016/129873 A2 | | 8/2016 | |
| WO | WO-2019/074149 A1 | | 4/2019 | |

* cited by examiner

LIGHT-EMITTING DEVICE

CROSS-REFERENCE TO RELATED APPLICATIONS

This application claims priority to Japanese Patent Application No. 2020-079040, filed on Apr. 28, 2020, and Japanese Patent Application No. 2020-201968, filed on Dec. 4, 2020, the disclosures of both of which are hereby incorporated by reference in their entireties.

BACKGROUND

The present disclosure relates to a light-emitting device.

For example, JP-A 2015-177181 describes a light-emitting device including a substrate in which a multilayer interconnect layer is formed, and multiple semiconductor light-emitting elements are mounted on the substrate.

SUMMARY

The present disclosure is directed to a light-emitting device in which multiple light-emitting elements can be individually controlled without increasing the complexity of the interconnect structure of the substrate.

In an embodiment of the present disclosure, a light-emitting device comprises a substrate comprising a first side and a second side, the first and second sides extending along a first direction, a second direction from the first side toward the second side being orthogonal to the first direction; n light-emitting elements (n being a natural number of 2 or more) mounted on the substrate, the n light-emitting elements comprising at least a first light-emitting element and a second light-emitting element; and n+1 interconnects provided on the substrate, the n+1 interconnects comprising at least a first interconnect comprising a first external connection portion, a second interconnect comprising a second external connection portion, and a third interconnect comprising a third external connection portion. In a top-view, the first light-emitting element is provided between the first side and the second light-emitting element, and the second light-emitting element is provided between the first light-emitting element and the second side. In top-view, the first external connection portion, the second external connection portion, and the third external connection portion are provided between the first side and the first light-emitting element. Each of the light-emitting elements comprises a first semiconductor layer of a first conductivity type, a second semiconductor layer of a second conductivity type, a light-emitting layer provided between the first semiconductor layer and the second semiconductor layer, a first bonding member electrically connected to the first semiconductor layer, and a second bonding member electrically connected to the second semiconductor layer. The first bonding member of the first light-emitting element is bonded to the first interconnect. The second bonding member of the first light-emitting element and the first bonding member of the second light-emitting element are bonded to the second interconnect. The second bonding member of the second light-emitting element is bonded to the third interconnect.

According to a light-emitting device of the present disclosure, multiple light-emitting elements can be individually controlled without increasing the complexity of the interconnect structure of the substrate.

DETAILED DESCRIPTION

Figure 1:
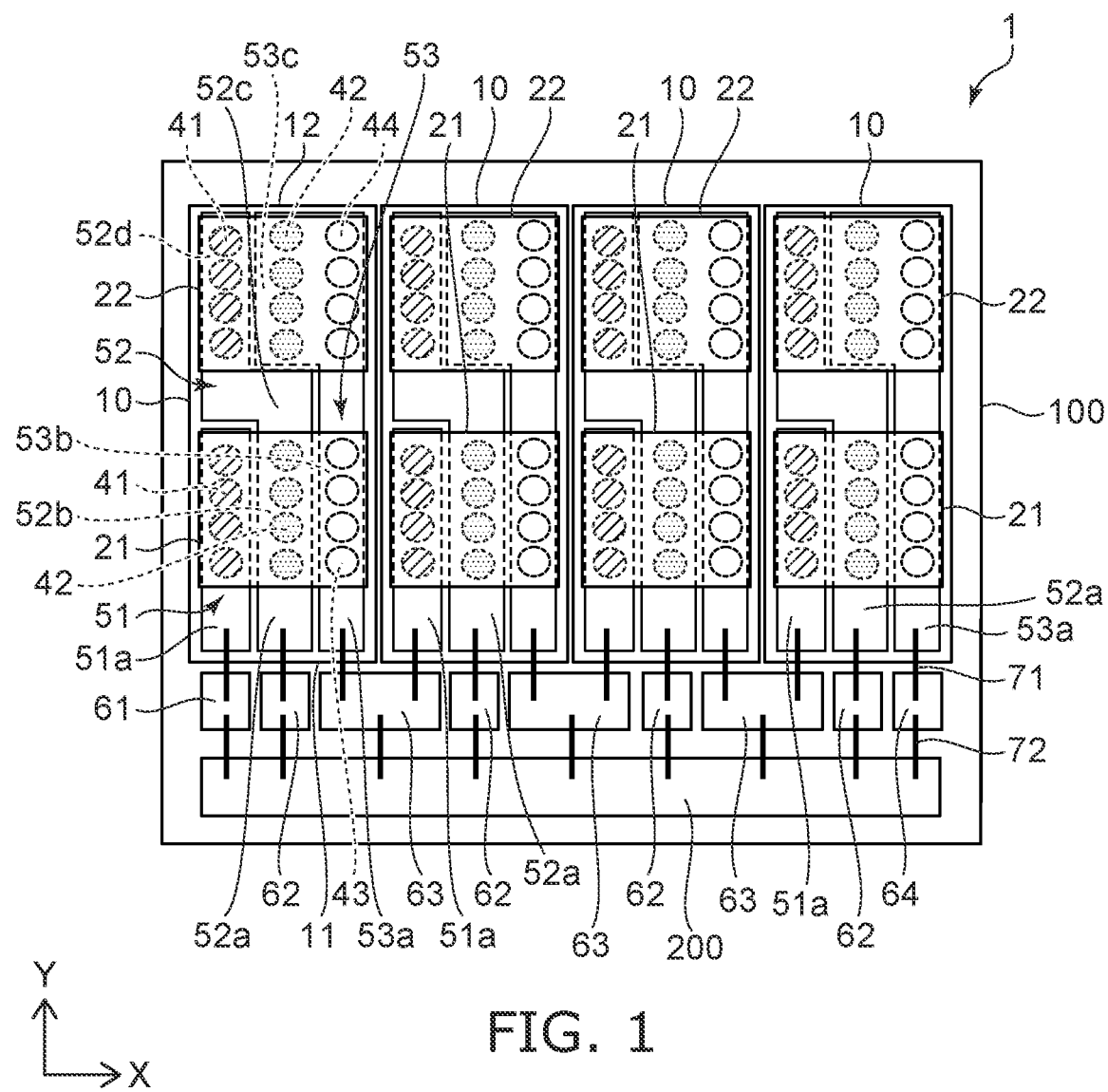
FIG. 1 is a schematic plan view showing a configuration of a light-emitting device of a first embodiment of the invention.

Embodiments will now be described with reference to the drawings. The same components in the drawings are marked with the same reference numerals.

First Embodiment

FIG. 1 is a schematic plan view showing a configuration of a light-emitting device 1 of a first embodiment of the invention.

The light-emitting device 1 includes a substrate 10, n light-emitting elements (n being a natural number of 2 or more) mounted on the substrate 10, and n+1 interconnects provided on the substrate 10. FIG. 1 shows an example in which n is 2; two light-emitting elements (a first light-emitting element 21 and a second light-emitting element 22) are mounted on one substrate 10, and three interconnects (a first interconnect 51, a second interconnect 52, and a third interconnect 53) are provided on the one substrate 10.

The substrate 10 is mounted on a circuit board 100. FIG. 1 shows an example in which, for example, four substrates 10 are mounted on the circuit board 100. Two light-emitting elements and three interconnects are provided for each of the four substrates 10.

Figure 2:
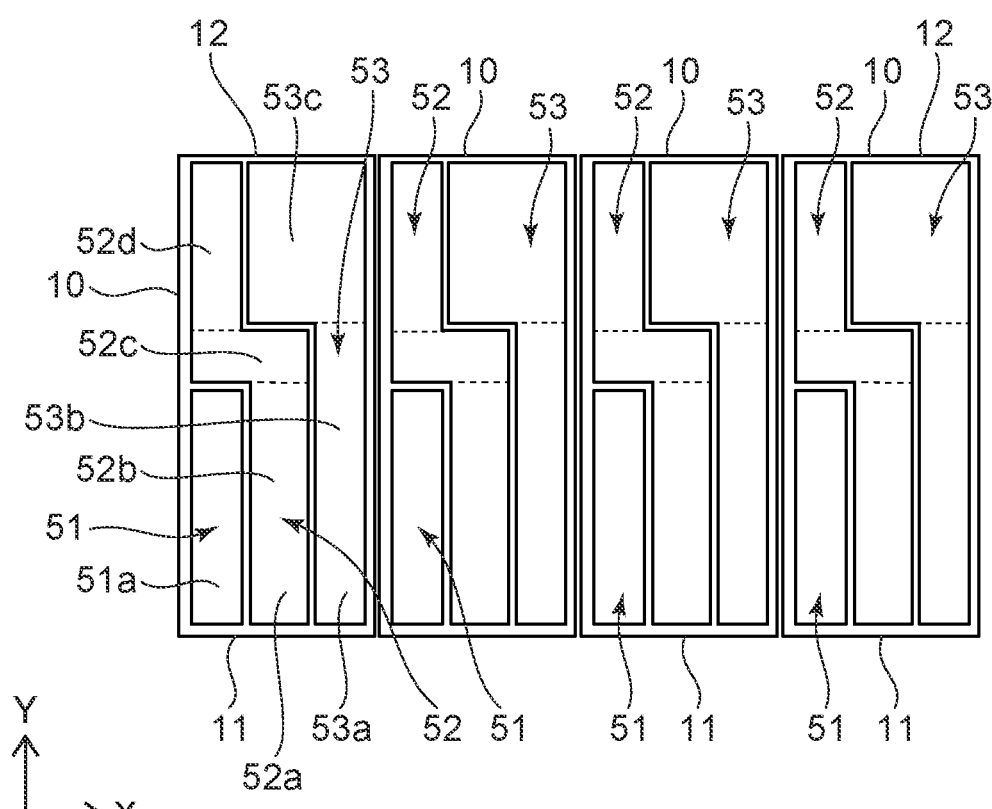
FIG. 2 is a schematic plan view of a substrate and an interconnects of the light-emitting device of the first embodiment of the invention.

FIG. 2 is a schematic plan view of the substrate 10 and the interconnects (the first interconnect 51, the second interconnect 52, and the third interconnect 53) provided on the substrate 10.

The substrate 10 is an insulating substrate, e.g., an aluminum nitride (AlN) substrate. The substrate 10 includes a first side 11 extending along a first direction X and a second side 12 extending along the first direction X. A second direction Y from the first side 11 toward the second side 12 is orthogonal to the first direction X. A side "extending along the first direction X" refers to a side that includes a portion parallel to the first direction X. A side "extending along the second direction Y" refers to a side that includes a portion parallel to the second direction Y.

The first interconnect 51, the second interconnect 52, and the third interconnect 53 are metal members. The outermost surfaces of the first, second, and third interconnects 51, 52, and 53 include, for example, gold (Au) or copper (Cu). The first interconnect 51, the second interconnect 52, and the third interconnect 53 are separated from each other on the substrate 10.

The first interconnect 51 includes a first external connection portion 51a positioned at the first side 11 side of the substrate 10. The second interconnect 52 includes a second external connection portion 52a positioned at the first side 11 side of the substrate 10. The third interconnect 53 includes a third external connection portion 53a positioned at the first side 11 side of the substrate 10.

In a top-view in FIG. 1, the first light-emitting element 21 is provided between the second light-emitting element 22 and the first side 11 of the substrate 10, and the second light-emitting element 22 is provided between the first light-emitting element 21 and the second side 12 of the substrate 10. In a top-view in FIG. 1, the first external connection portion 51a of the first interconnect 51, the second external connection portion 52a of the second interconnect 52, and the third external connection portion 53a of the third interconnect 53 are provided between the first light-emitting element 21 and the first side 11 of the substrate 10. The second external connection portion 52a is provided between the first external connection portion 51a and the third external connection portion 53a in the first direction X.

As shown in FIG. 2, the second interconnect 52 includes a rectangular first portion 52b extending in the second direction Y from the second external connection portion 52a, a rectangular second portion 52c extending in the first direction X from the first portion 52b, and a rectangular third portion 52d extending in the second direction Y from the second portion 52c. The boundary between the first portion 52b and the second portion 52c and the boundary between the second portion 52c and the third portion 52d are virtually illustrated by broken lines in FIG. 2. A first end in the first direction X of the second portion 52c is aligned with the first portion 52b in the second direction Y. A second end in the first direction X of the second portion 52c is aligned with the third portion 52d and the first interconnect 51 in the second direction Y. The first end in the first direction X of the second portion 52c is next to the first portion 52b in the second direction Y. The second end in the first direction X of the second portion 52c is next to the third portion 52d in the second direction Y.

As shown in FIG. 2, the third interconnect 53 includes a rectangular first portion 53b extending in the second direction Y from the third external connection portion 53a, and a rectangular second portion 53c extending in the first direction X from the first portion 53b. The boundary between the first portion 53b and the second portion 53c is virtually illustrated by a broken line in FIG. 2. A first end in the first direction X of the second portion 53c is aligned with the first portion 53b in the second direction Y. A second end in the first direction X of the second portion 53c is aligned with the first portion 52b of the second interconnect 52 in the second direction Y.

The light-emitting element will now be described.

Figure 3:
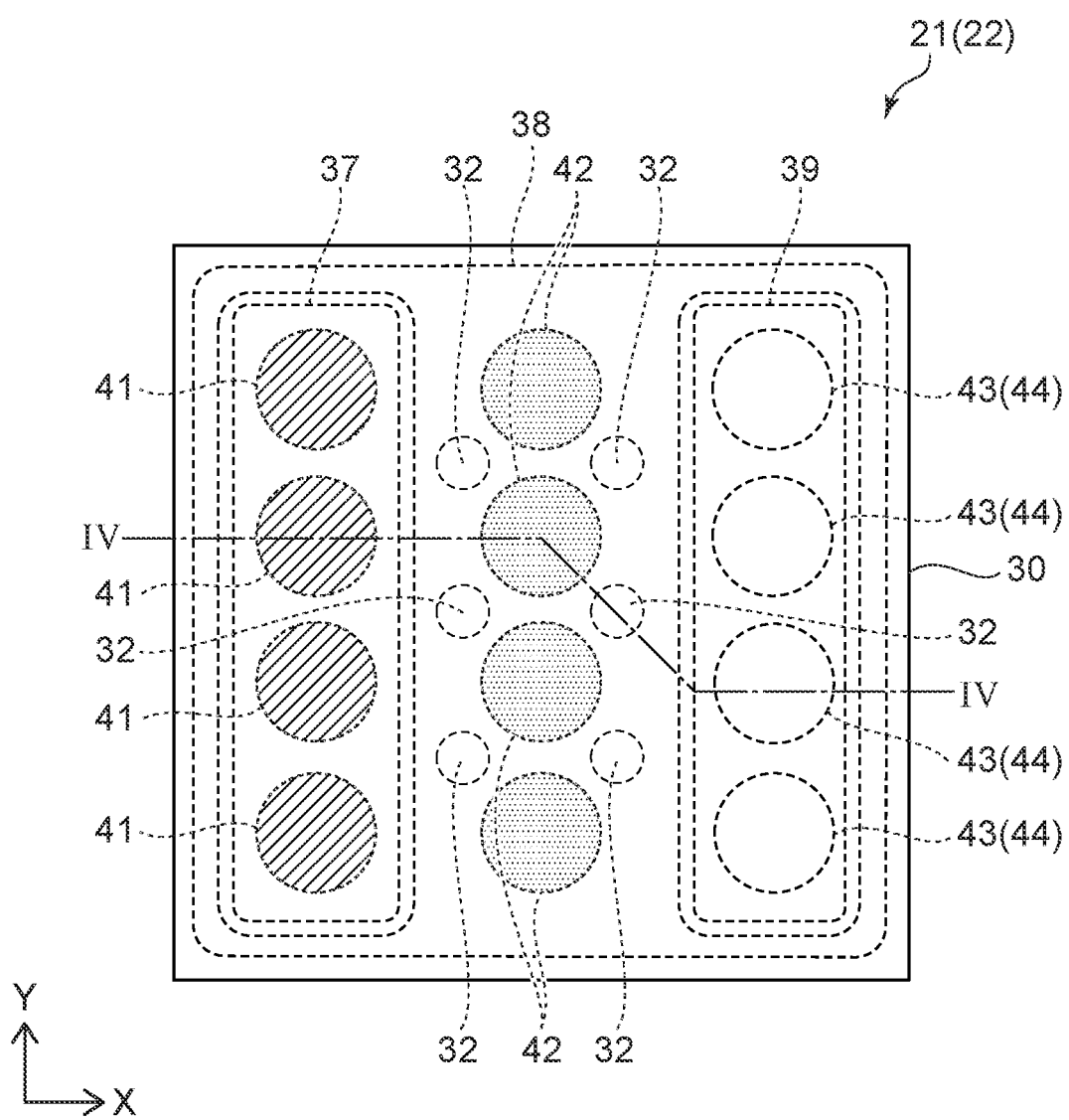
FIG. 3 is a schematic plan view of a light-emitting element of the light-emitting device of the first embodiment of the invention.
Figure 4:
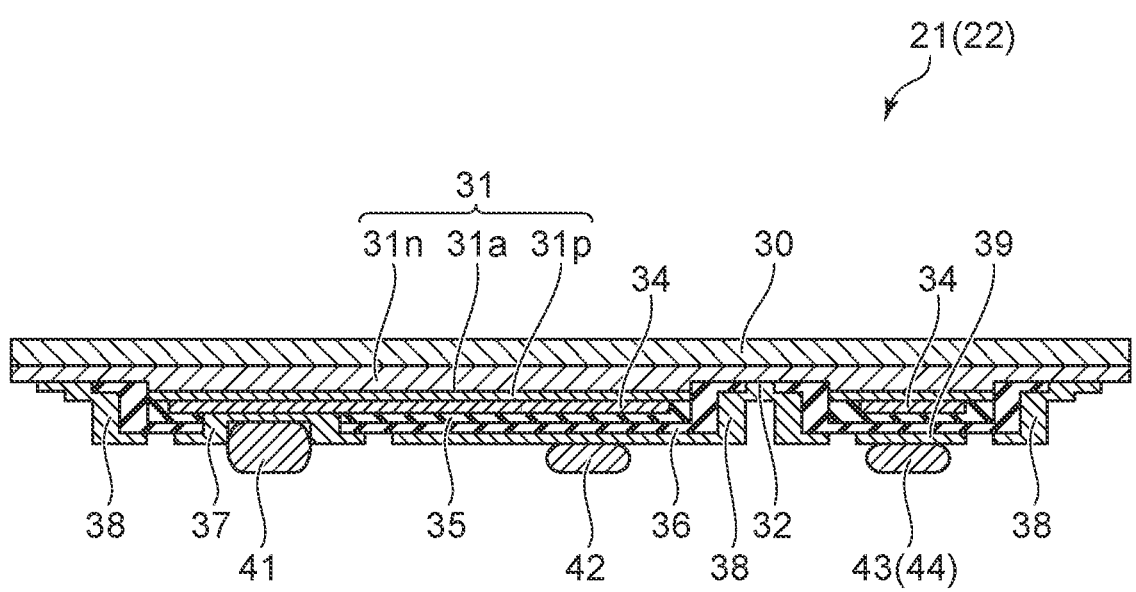
FIG. 4 is a schematic cross-sectional view along line IV-IV of FIG. 3.

FIG. 3 is a schematic plan view of the first light-emitting element 21. FIG. 4 is a schematic cross-sectional view along line IV-IV of FIG. 3.

In the description hereinbelow, a first conductivity type is taken as a p-type, and a second conductivity type is taken as an n-type. The first conductivity type may be the n-type, and the second conductivity type may be the p-type.

As shown in FIG. 4, the first light-emitting element 21 includes a support substrate 30 and a semiconductor stacked body 31. The semiconductor stacked body 31 is grown on the support substrate 30. The support substrate 30 is, for example, a sapphire substrate. The semiconductor stacked body 31 includes, for example, nitride semiconductor layers. For example, the first light-emitting element 21 is rectangular in a top-view. In case the first light-emitting element 21 is rectangular in a top-view, the length of one side is, for example, not less than 500 μm and not more than 1500 μm.

The semiconductor stacked body 31 includes a p-type first semiconductor layer 31p, an n-type second semiconductor layer 31n, and a light-emitting layer 31a provided between the first semiconductor layer 31p and the second semiconductor layer 31n. The second semiconductor layer 31n, the light-emitting layer 31a, and the first semiconductor layer 31p are provided on the support substrate 30 in order from the support substrate 30 side.

The second semiconductor layer 31n includes multiple conduction portions 32. The light-emitting layer 31a and the first semiconductor layer 31p are not provided at the conduction portions 32. The conduction portions 32 are, for example, circular in a top-view.

The first light-emitting element 21 further includes a reflecting electrode 34, a first pad electrode 37, a second pad electrode 38, a third pad electrode 39, a first bonding member 41, a second bonding member 42, a third bonding member 43, a first insulating film 35, and a second insulating film 36.

The second light-emitting element 22 has the same configuration as the first light-emitting element 21. In the second light-emitting element 22, the structure that corresponds to the third bonding member 43 of the first light-emitting element 21 is taken as a fourth bonding member 44. The third bonding member 43 and the fourth bonding member 44 have the same structure. In other words, the second light-emitting element 22 includes the support substrate 30, the semiconductor stacked body 31, the reflecting electrode 34, the first pad electrode 37, the second pad electrode 38, the third pad electrode 39, the first bonding member 41, the second bonding member 42, the fourth bonding member 44, the first insulating film 35, and the second insulating film 36. The second light-emitting element 22 is, for example, rectangular in a top-view. In case the second light-emitting element 22 is rectangular in a top-view, the length of one side is, for example, not less than 500 μm and not more than 1500 μm.

The reflecting electrode 34 is provided at the surface of the first semiconductor layer 31p and is connected to the first semiconductor layer 31p. The reflecting electrode 34 includes, for example, silver (Ag). The first insulating film 35 is provided on the surface of the first semiconductor layer 31p to cover the reflecting electrode 34. The first insulating film 35 is, for example, a silicon nitride film.

The second insulating film 36 covers the first insulating film 35. The second insulating film 36 also covers the side surface of the light-emitting layer 31a and the side surface of the first semiconductor layer 31p.

A portion of the first pad electrode 37, a portion of the second pad electrode 38, and a portion of the third pad electrode 39 are provided on the second insulating film 36. The first pad electrode 37, the second pad electrode 38, and the third pad electrode 39 are separated from each other on the second insulating film 36. The first pad electrode 37, the second pad electrode 38, and the third pad electrode 39 include, for example, aluminum (Al).

An opening that exposes a portion of the reflecting electrode 34 is formed in a portion of the first insulating film 35 and a portion of the second insulating film 36 in a region overlapping the reflecting electrode 34. A portion of the first pad electrode 37 contacts the reflecting electrode 34 via the opening exposing the portion of the reflecting electrode 34.

An opening that exposes a portion of the conduction portion 32 is formed in a portion of the second insulating film 36 covering the conduction portion 32. A portion of the second pad electrode 38 contacts the conduction portion 32 via the opening exposing the portion of the conduction portion 32. The second pad electrode 38 is connected to the second semiconductor layer 31n.

The third pad electrode 39 is provided in a region overlapping the reflecting electrode 34 with the first and second insulating films 35 and 36 interposed therebetween. The first insulating film 35 and the second insulating film 36 are provided between the third pad electrode 39 and the reflecting electrode 34. The third pad electrode 39 does not contact the reflecting electrode 34.

The multiple first bonding members 41 are bonded to the first pad electrode 37. In the example shown in FIG. 3, four first bonding members 41 are arranged along the second direction Y. In a top-view of the application, the first bonding members 41 are illustrated by circles having hatching patterns.

The first bonding member 41 is electrically connected to the first semiconductor layer 31p via the first pad electrode 37 and the reflecting electrode 34.

Multiple second bonding members 42 are bonded to the second pad electrode 38. In the example shown in FIG. 3, four second bonding members 42 are arranged along the second direction Y. In a top-view of the application, the second bonding members 42 are illustrated by circles having dot patterns.

The second bonding member 42 is electrically connected to the second semiconductor layer 31n via the second pad electrode 38 and the conduction portion 32.

Multiple third bonding members 43 (fourth bonding members 44) are bonded to the third pad electrode 39. In the example shown in FIG. 3, four third bonding members 43 (fourth bonding members 44) are arranged along the second direction Y. The third bonding members 43 (the fourth bonding members 44) are electrically insulated from the semiconductor stacked body 31.

The second bonding member 42 is provided between the first bonding member 41 and the third bonding member 43 (the fourth bonding member 44) in the first direction X.

The first bonding member 41, the second bonding member 42, and the third bonding member 43 (the fourth bonding member 44) are ball-shaped conductive members such as bumps or columnar conductive members formed by plating. The first bonding member 41, the second bonding member 42, and the third bonding member 43 (the fourth bonding member 44) include, for example, gold or tin.

The first light-emitting element 21 and the second light-emitting element 22 are between the substrate 10 and the support substrate 30 in a state in which the first light-emitting element 21 and the second light-emitting element 22 are mounted on the substrate 10. In a top-view, the shortest distance between the first light-emitting element 21 and the second light-emitting element 22 is, for example, not less than 50 μm and not more than 120 μm.

As shown in FIG. 1, the first bonding member 41 of the first light-emitting element 21 is bonded to the first interconnect 51.

The second bonding member 42 of the first light-emitting element 21 and the first bonding member 41 of the second light-emitting element 22 are bonded to the second interconnect 52. The second bonding member 42 of the first light-emitting element 21 is bonded to the first portion 52b of the second interconnect 52. The first bonding member 41 of the second light-emitting element 22 is bonded to the third portion 52d of the second interconnect 52.

The third bonding member 43 of the first light-emitting element 21 and the second and fourth bonding members 42 and 44 of the second light-emitting element 22 are bonded to the third interconnect 53. The third bonding member 43 of the first light-emitting element 21 is bonded to the first portion 53b of the third interconnect 53. The second and fourth bonding members 42 and 44 of the second light-emitting element 22 are bonded to the second portion 53c of the third interconnect 53.

In a top-view, the second portion 52c of the second interconnect 52 is positioned between the first light-emitting element 21 and the second light-emitting element 22.

A position of the first bonding member 41 in the first light-emitting element 21 is the same as a position of the first bonding member 41 in the second light-emitting element 22. A position of the second bonding member 42 in the first light-emitting element 21 is the same as a position of the second bonding member 42 in the second light-emitting element 22. A position of the third bonding member 43 in the first light-emitting element 21 is the same as a position of the fourth bonding member 44 in the second light-emitting element 22.

The first bonding member 41 of the first light-emitting element 21 and the first bonding member 41 of the second light-emitting element 22 are aligned along the second direction Y. The second bonding member 42 of the first light-emitting element 21 and the second bonding member 42 of the second light-emitting element 22 are aligned along the second direction Y. The third bonding member 43 of the first light-emitting element 21 and the fourth bonding member 44 of the second light-emitting element 22 are aligned along the second direction Y.

In the example shown in FIG. 1, four substrates 10 are arranged in the first direction X on the circuit board 100, four first light-emitting elements 21 are arranged in the first direction X on the circuit board 100, and four second light-emitting elements 22 are arranged in the first direction X on the circuit board 100. The numbers of the substrates 10, the first light-emitting elements 21, and the second light-emitting elements 22 on the circuit board 100 are not limited to the numbers shown in FIG. 1.

A first power supply terminal 61, a second power supply terminal 62, a third power supply terminal 63, and a fourth power supply terminal 64 are provided on the circuit board 100. The first power supply terminal 61, the second power supply terminal 62, the third power supply terminal 63, and the fourth power supply terminal 64 are formed as a conductor pattern on the circuit board 100.

A control element 200 is mounted on the circuit board 100. The control element 200 controls the driving of the multiple light-emitting elements 21 and 22 located on the circuit board 100. The first power supply terminal 61, the second power supply terminal 62, the third power supply terminal 63, and the fourth power supply terminal 64 are electrically connected to the control element 200 by conductive members 72. The conductive members 72 are, for example, metal wires or a conductor pattern formed on the circuit board 100.

The multiple power supply terminals 61, 62, 63, and 64 are provided between the control element 200 and the first side 11 of the substrate 10. The multiple power supply terminals 61, 62, 63, and 64 are arranged along the first direction X. In the arrangement of the multiple power supply terminals 61, 62, 63, and 64, the first power supply terminal 61 is located at a first end (the left end in FIG. 1), and the fourth power supply terminal 64 is located at a second end (the right end in FIG. 1).

The first external connection portion 51a of the first interconnect 51 that is located at the first end in the first direction X (the left end in FIG. 1) is electrically connected to the first power supply terminal 61 by a conductive member 71. The conductive member 71 is, for example, a metal wire or a conductor pattern formed on the circuit board 100.

The third external connection portion 53a of the third interconnect 53 that is located at the second end in the first direction X (the right end in FIG. 1) is electrically connected to the fourth power supply terminal 64 by the conductive member 71.

The second external connection portions 52a of the second interconnects 52 are electrically connected respectively to the second power supply terminals 62 by the conductive members 71.

The third external connection portion 53a and the first external connection portion 51a that are next to each other in the first direction X are electrically connected to a common third power supply terminal 63 by the conductive members 71.

The second interconnect 52 connects the second bonding member 42 that is electrically connected to the n-type second semiconductor layer 31n of the first light-emitting element 21 and the first bonding member 41 that is electrically connected to the p-type first semiconductor layer 31p of the second light-emitting element 22. Accordingly, the first light-emitting element 21 and the second light-emitting element 22 that are mounted on one substrate 10 are connected in series to each other.

The n-type second semiconductor layer 31n of the second light-emitting element 22 mounted to a first substrate 10 of two substrates 10 next to each other in the first direction X and the p-type first semiconductor layer 31p of the first light-emitting element 21 mounted to a second substrate 10 of the two substrates 10 are electrically connected via the third interconnect 53 on the first substrate 10, the third power supply terminal 63, and the first interconnect 51 on the second substrate 10.

In other words, the multiple light-emitting elements 21 and 22 on the circuit board 100 are connected in series by the multiple interconnects 51, 52, and 53 and the multiple power supply terminals 61, 62, 63, and 64. An example will now be described with reference to FIG. 1 in which the light-emitting layer 31a of any one or more light-emitting elements of the multiple light-emitting elements 21 and 22 can be caused to emit light by applying a potential difference between any two power supply terminals of the multiple power supply terminals 61, 62, 63, and 64.

In FIG. 1, the first light-emitting element 21 at the left end can be caused to emit light by supplying a current to the light-emitting layer 31a of the first light-emitting element 21 at the left end by supplying a current between the first power supply terminal 61 located at the left end and the second power supply terminal 62 located right-adjacent to the first power supply terminal 61.

In FIG. 1, all of the light-emitting elements 21 and 22 on the circuit board 100 can be caused to simultaneously emit light by supplying a current to the light-emitting layers 31a of all of the light-emitting elements 21 and 22 by applying a first potential to the first power supply terminal 61 located at the left end, by applying a second potential, which is less than the first potential, to the fourth power supply terminal 64 located at the right end, and by setting the potentials of the other power supply terminals to be floating.

In FIG. 1, the second light-emitting element 22 at the left end can be caused to emit light by supplying a current to the light-emitting layer 31a of the second light-emitting element 22 at the left end by applying a voltage between the second power supply terminal 62 connected to the second external connection portion 52a on the substrate 10 located at the left end and the third power supply terminal 63 located right-adjacent to the second power supply terminal 62.

In FIG. 1, the second light-emitting element 22 at the right end can be caused to emit light by supplying a current to the light-emitting layer 31a of the second light-emitting element 22 at the right end by applying a voltage between the fourth power supply terminal 64 located at the right end and the second power supply terminal 62 located left-adjacent to the fourth power supply terminal 64.

In FIG. 1, the first light-emitting element 21 at the right end can be caused to emit light by supplying a current to the light-emitting layer 31a of the first light-emitting element 21 at the right end by applying a voltage between the second power supply terminal 62 connected to the second external connection portion 52a on the substrate 10 located at the right end and the third power supply terminal 63 located left-adjacent to the second power supply terminal 62.

By applying a voltage between the third power supply terminal 63 and the second power supply terminal 62 next to each other in the first direction X, any first light-emitting element 21 connected to the third power supply terminal 63 and the second power supply terminal 62 via the first interconnect 51 and the second interconnect 52 can be caused to emit light, and any second light-emitting element 22 connected to the third power supply terminal 63 and the second power supply terminal 62 via the second interconnect 52 and the third interconnect 53 can be caused to emit light.

The multiple light-emitting elements 21 and 22 that are connected in series between any two power supply terminals separated from each other in the first direction X can be caused to simultaneously emit light by applying a potential difference between the two power supply terminals.

For example, in FIG. 1, a voltage is applied between the first power supply terminal 61 located at the left end and the second power supply terminal 62 connected to the second external connection portion 52a on the substrate 10 located second from the left. Thereby, the first light-emitting element 21 at the left end, the second light-emitting element 22 at the left end, and the first light-emitting element 21 positioned second from the left can be caused to emit light.

According to the embodiment, for n light-emitting elements 21 and 22 (n being a natural number of 2 or more), it is possible to control the individual light emission and/or the simultaneous light emission of the multiple light-emitting elements 21 and 22 by a simple interconnect structure that uses n+1 interconnects 51, 52, and 53, i.e., one more interconnect than the number of the light-emitting elements 21 and 22. For example, the interconnect structure can be simplified compared to when a pair of interconnects at the anode and cathode sides are provided on the substrate 10 for each of the light-emitting elements 21 and 22.

The external connection portions 51a, 52a, and 53a of all of the interconnects 51, 52, and 53 are located between the first light-emitting element 21 and the first side 11 of the substrate 10. For example, compared to when the light-emitting elements 21 and 22 are sandwiched between multiple external connection portions, such a structure can reduce the planar size of the entire light-emitting device 1 even though the light emission area is the same. Or, for the same planar size of the entire light-emitting device 1, the light emission area can be increased compared to a reference example because the space for arranging the external connection portions can be reduced.

Because all of the external connection portions 51a, 52a, and 53a are at the first side 11 side of the substrate 10, the power supply terminals 61, 62, 63, and 64 and the control element 200 can be located at the first side 11 side, and the positioning of the members on the circuit board 100 can be simplified. Also, the multiple light-emitting elements 21 and 22 can be densely arranged, and a wide light-emitting region with low uneven luminance can be formed.

Other than the first bonding member 41 and the second bonding member 42 that ensure the electrical connection between the semiconductor stacked body 31 and the interconnects 51, 52, and 53, the first light-emitting element 21 includes the third bonding member 43. Other than the first bonding member 41 and the second bonding member 42 that ensure the electrical connection between the semiconductor stacked body 31 and the interconnects 51, 52, and 53, the second light-emitting element 22 includes the fourth bonding member 44. Due to the third and fourth bonding members 43 and 44, the first light-emitting element 21 and the second light-emitting element 22 can be stably mounted on the substrate 10, and the heat dissipation of the first and second light-emitting elements 21 and 22 is improved.

Second Embodiment

Figure 5:
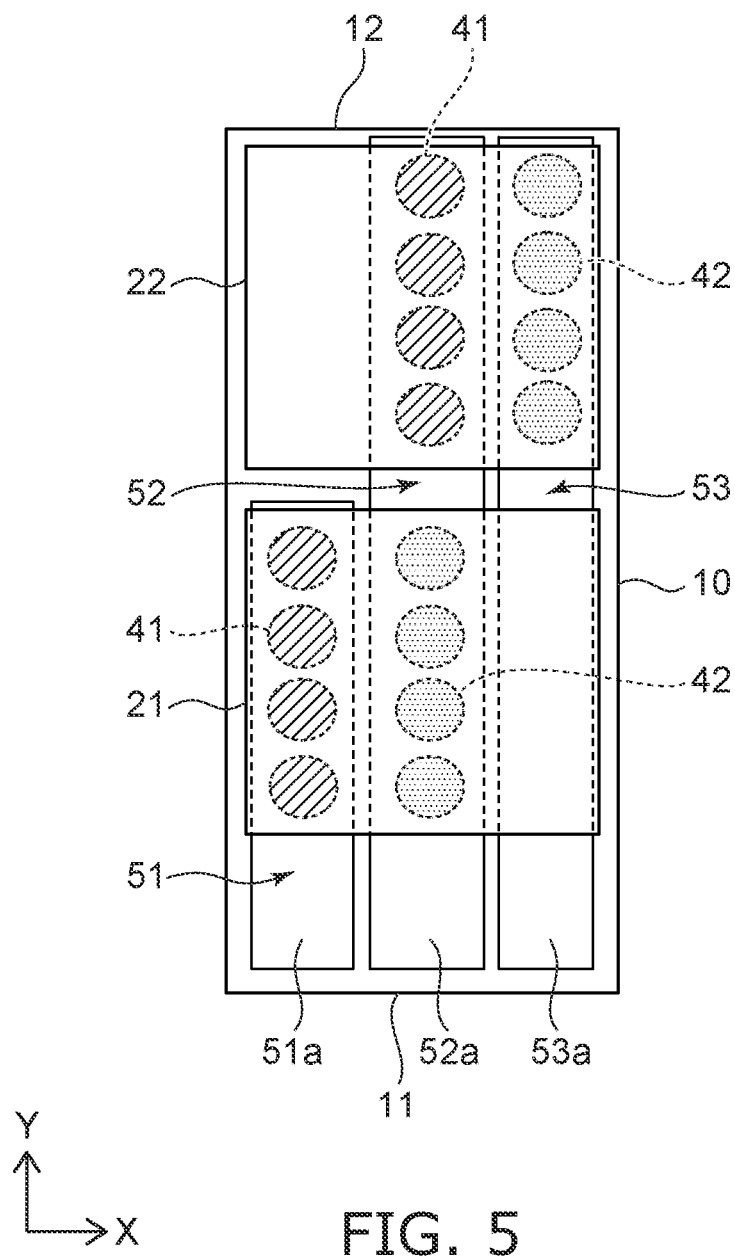
FIG. 5 is a schematic plan view showing a configuration of a light-emitting device of a second embodiment of the invention.

FIG. 5 is a schematic plan view showing a configuration of a light-emitting device of a second embodiment of the invention. As shown in FIG. 5, the second interconnect 52 and the third interconnect 53 may be formed in line shapes extending in the second direction Y. In such a case, the positions of the first and second bonding members 41 and 42 in the first light-emitting element 21 and the positions of the first and second bonding members 41 and 42 in the second light-emitting element 22 are different from those of the first embodiment.

The second bonding member 42 of the first light-emitting element 21 is located at the central portion in the first direction X of the first light-emitting element 21. The first bonding member 41 of the first light-emitting element 21 is located more proximate to the end of the first light-emitting element 21 than the second bonding member 42 in the first direction X. The first bonding member 41 of the second light-emitting element 22 is located at the central portion in the first direction X of the second light-emitting element 22. The second bonding member 42 of the second light-emitting element 22 is located more proximate to the end of the second light-emitting element 22 than the first bonding member 41 in the first direction X. Accordingly, it is necessary for the positions of the first pad electrode 37 to which the first bonding member 41 is bonded and the second pad electrode 38 to which the second bonding member 42 is bonded to be different between the first light-emitting element 21 and the second light-emitting element 22.

Conversely, in the first embodiment shown in FIG. 1, because the shapes of the second and third interconnects 52 and 53 are nonlinear, the positions of the first and second bonding members 41 and 42 in the first light-emitting element 21 and the positions of the first and second bonding members 41 and 42 in the second light-emitting element 22 can be the same. In other words, light-emitting elements that have the same bonding member positions can be used commonly for the first light-emitting element 21 and the second light-emitting element 22. It is unnecessary to individually make light-emitting elements having different bonding member positions, and the cost can be lower.

In the first embodiment shown in FIG. 1, the position of the third bonding member 43 in the first light-emitting element 21 and the position of the fourth bonding member 44 in the second light-emitting element 22 are the same. Accordingly, even when the third bonding member 43 and the fourth bonding member 44 are provided, light-emitting elements that have the same bonding member positions can be used commonly for the first light-emitting element 21 and the second light-emitting element 22.

Third Embodiment

Figure 6:
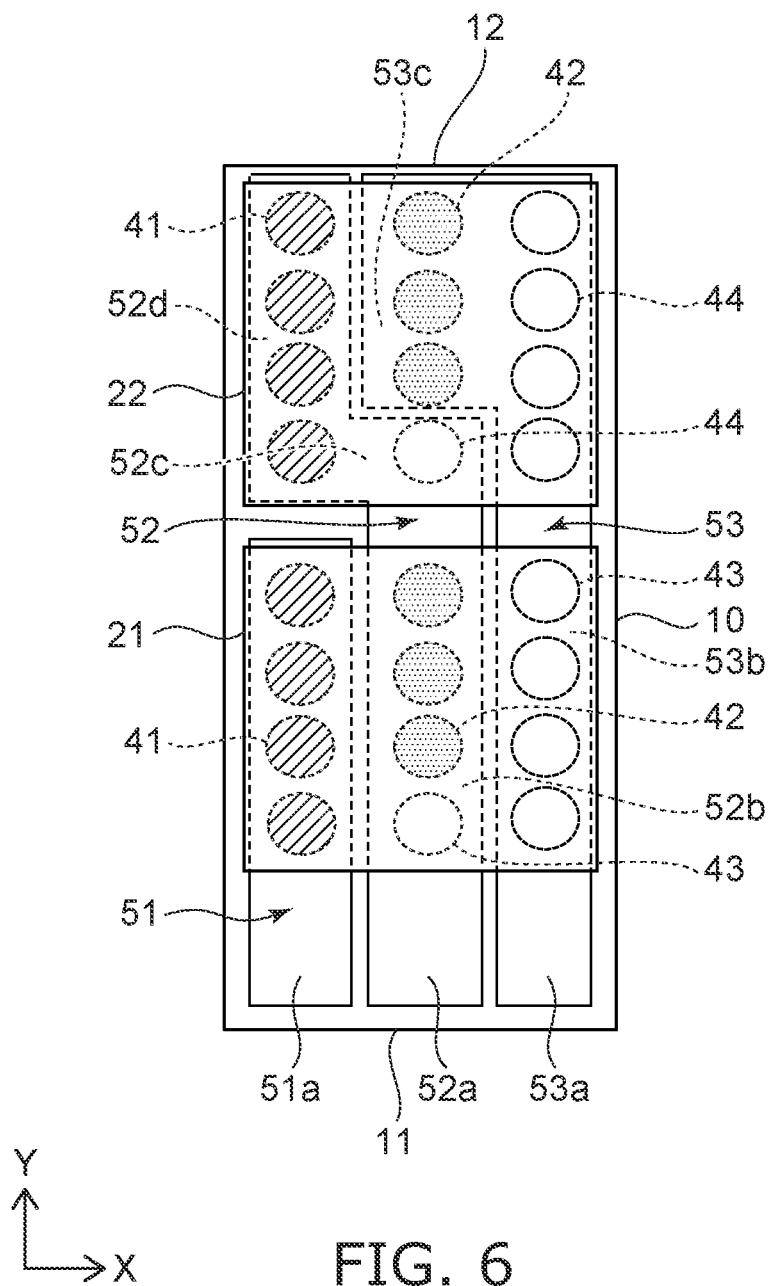
FIG. 6 is a schematic plan view showing a configuration of a light-emitting device of a third embodiment of the invention.

FIG. 6 is a schematic plan view showing a configuration of a light-emitting device of a third embodiment of the invention. FIG. 6 shows an example in which the second portion 52c of the second interconnect 52 is positioned in a region overlapping the second light-emitting element 22. The second interconnect 52 connects the first light-emitting element 21 and the second light-emitting element 22 in series and is bonded to the second bonding member 42 of the first light-emitting element 21 and the first bonding member 41 of the second light-emitting element 22. The second bonding member 42 of the second light-emitting element 22 is not bonded to the second portion 52c; and the fourth bonding member 44, which is electrically floating, is bonded to the second portion 52c. In other words, one fourth bonding member 44 and three second bonding members 42 are arranged along the second direction Y at the central portion in the first direction X of the second light-emitting element 22. Because the first light-emitting element 21 has the same design as the second light-emitting element 22, one third bonding member 43 and three second bonding members 42 are arranged along the second direction Y at the central portion in the first direction X of the first light-emitting element 21 as well. By such a configuration, compared to the configuration of the first embodiment shown in FIG. 1, the distance between the first light-emitting element 21 and the second light-emitting element 22 in the second direction Y can be short, and the entire light-emitting device can be downsized.

In the first embodiment shown in FIG. 1, the second portion 52c of the second interconnect 52 is positioned between the first light-emitting element 21 and the second light-emitting element 22, and the bonding members 41, 42, 43, and 44 are not located at the second portion 52c of the second interconnect 52. In the first embodiment shown in FIG. 1, compared to the third embodiment shown in FIG. 6, the number of the second bonding members 42 for electrical connection to the semiconductor stacked body 31 in each of one first light-emitting element 21 and one second light-emitting element 22 can be increased. Thereby, the heat dissipation of the heat emitted by the semiconductor stacked body 31 can be improved, and the resistance when supplying the current to the semiconductor stacked body 31 can be reduced.

Fourth Embodiment

Figure 7:
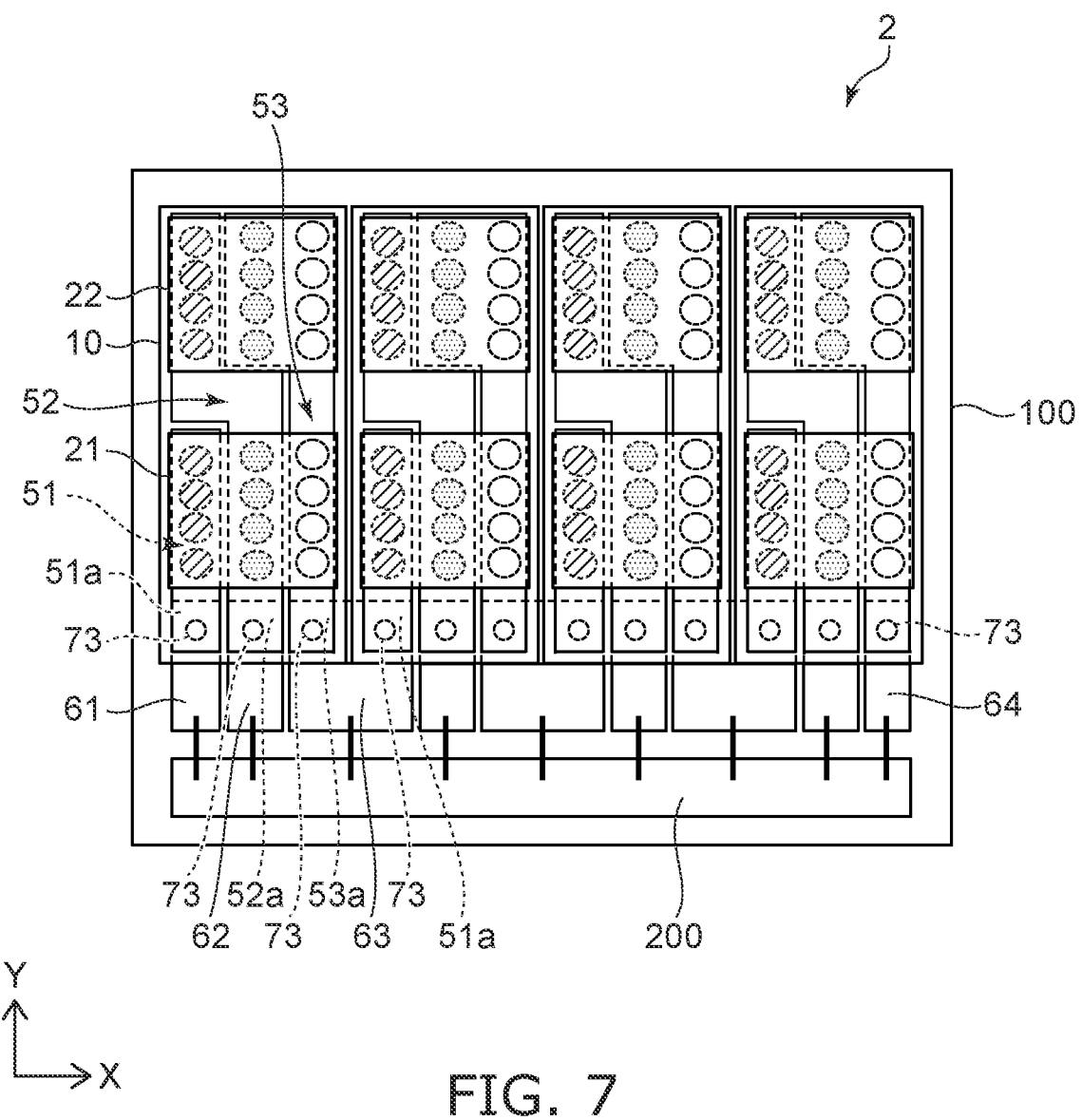
FIG. 7 is a schematic plan view showing a configuration of a light-emitting device of a fourth embodiment of the invention.

FIG. 7 is a schematic plan view showing a configuration of a light-emitting device 2 of a fourth embodiment of the invention.

In the light-emitting device 2, the external connection portions 51a, 52a, and 53a are electrically connected to the power supply terminals 61, 62, 63, and 64 by conductive portions 73. The external connection portions 51a, 52a, and 53a are formed at the front surface of the substrate 10, and portions of the power supply terminals 61, 62, 63, and 64 extend over the back surface of the substrate 10. The conductive portions 73 extend through the substrate 10 and connect the external connection portions 51a, 52a, and 53a and the power supply terminals 61, 62, 63, and 64.

Fifth Embodiment

Figure 8:
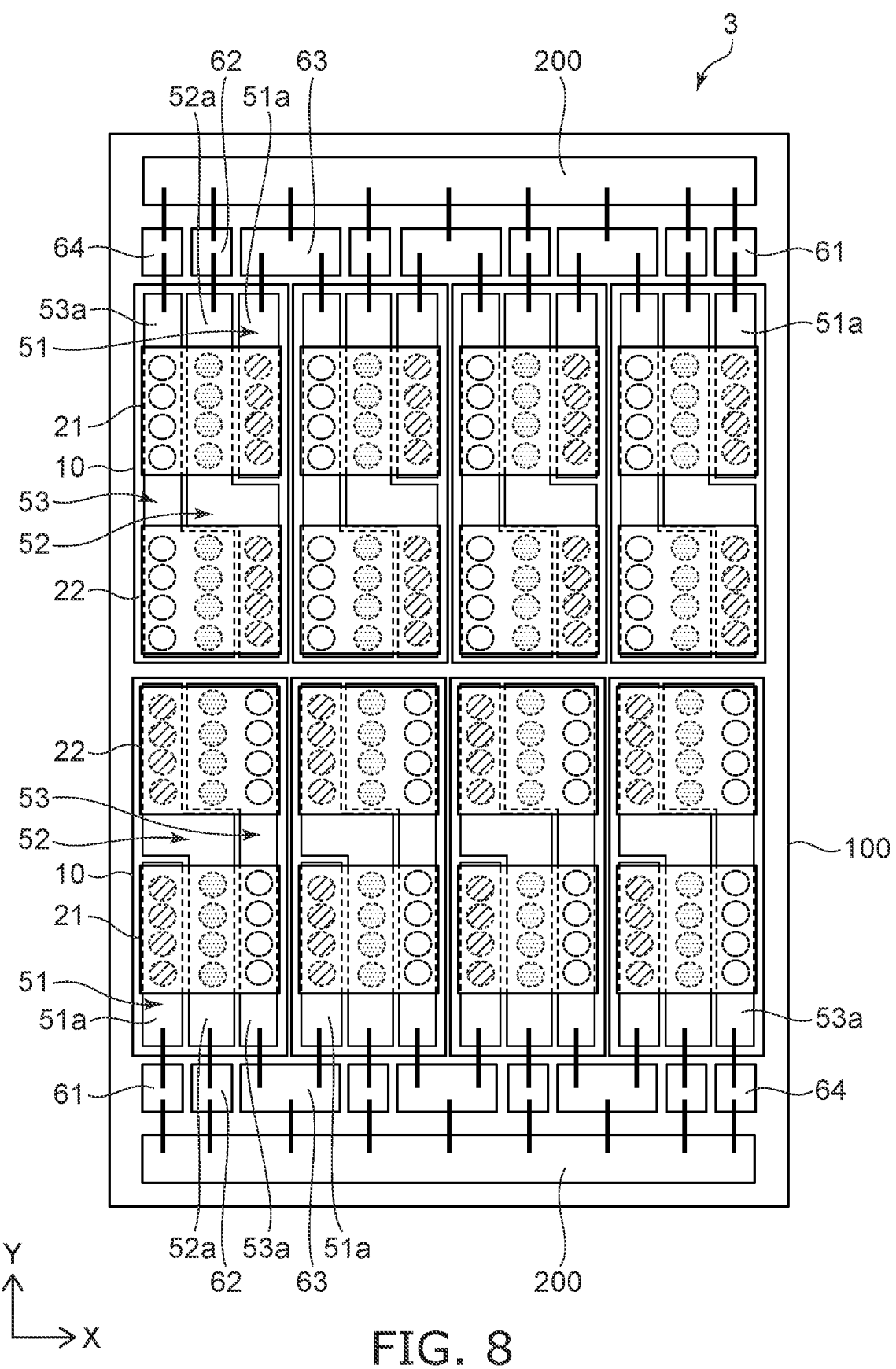
FIG. 8 is a schematic plan view showing a configuration of a light-emitting device of a fifth embodiment of the invention.

FIG. 8 is a schematic plan view showing a configuration of a light-emitting device 3 of a fifth embodiment of the invention.

One unit includes the configuration on the circuit board 100 shown in FIG. 1 (the substrate 10, the light-emitting elements 21 and 22, the interconnects 51, 52, and 53, the power supply terminals 61, 62, 63, and 64, the conductive members 71 and 72, and the control element 200); and two such units are provided on the circuit board 100 in the light-emitting device 3 shown in FIG. 8. The two units are arranged with line symmetry in the second direction Y.

The number of the light-emitting elements mounted on one substrate 10 is not limited to two and may be three or more. In such a case as well, n+1 interconnects are formed on one substrate 10, where n is the number of the light-emitting elements on one substrate 10.

Sixth Embodiment

Figure 9:
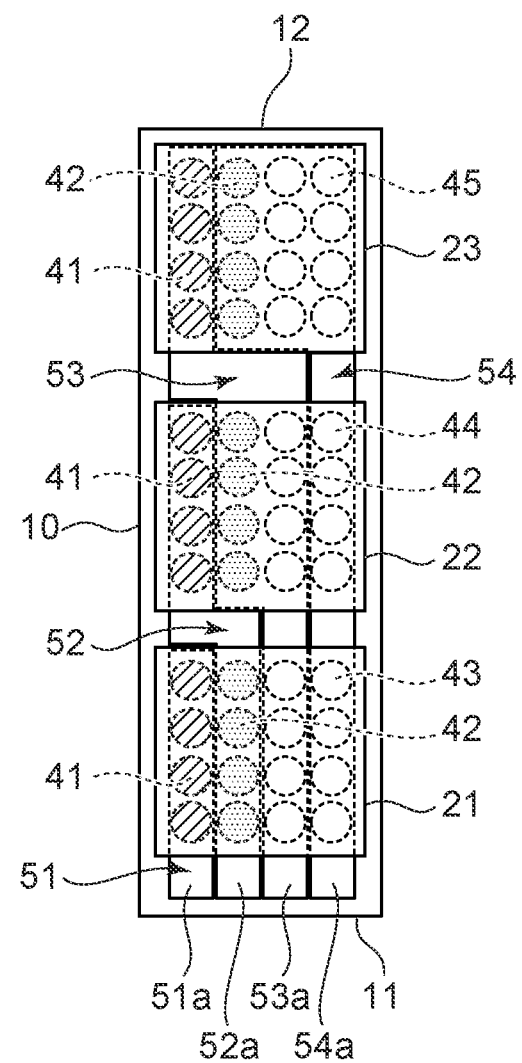
FIG. 9 is a schematic plan view showing a configuration of a light-emitting device of a sixth embodiment of the invention.

FIG. 9 is a schematic plan view showing a configuration of a light-emitting device of a sixth embodiment of the invention. FIG. 9 shows an example of three light-emitting elements (the first light-emitting element 21, the second light-emitting element 22, and a third light-emitting element 23) and four interconnects (the first interconnect 51, the second interconnect 52, the third interconnect 53, and a fourth interconnect 54) provided on one substrate 10. Compared to the configuration shown in FIG. 1, the configuration shown in FIG. 9 further includes the third light-emitting element 23 and the fourth interconnect 54. Also, compared to the configuration shown in FIG. 1, the third bonding members 43, the fourth bonding members 44, and fifth bonding members 45 each are arranged along the second direction Y to form two columns each in the configuration shown in FIG. 9.

The third light-emitting element 23 has the same configuration as the first and second light-emitting elements 21 and 22. In a top-view in FIG. 9, the third light-emitting element 23 is provided between the second light-emitting element 22 and the second side 12 of the substrate 10.

The fourth interconnect 54 includes a fourth external connection portion 54a. The first external connection portion 51a of the first interconnect 51, the second external connection portion 52a of the second interconnect 52, the third external connection portion 53a of the third interconnect 53, and the fourth external connection portion 54a of the fourth interconnect 54 are located between the first light-emitting element 21 and the first side 11 of the substrate 10.

In the first direction X, the second external connection portion 52a is located between the first external connection portion 51a and the third external connection portion 53a, and the third external connection portion 53a is located between the second external connection portion 52a and the fourth external connection portion 54a.

The third light-emitting element 23 includes the first bonding member 41 electrically connected to the first semiconductor layer 31p, and the second bonding member 42 electrically connected to the second semiconductor layer 31n. The third light-emitting element 23 further includes the fifth bonding member 45. The fifth bonding member 45 has the same configuration as the third and fourth bonding members 43 and 44, is insulated from the first and second semiconductor layers 31p and 31n, and is in an electrically floating state.

The positions of the bonding members 41, 42, 43, 44, and 45 are the same between the light-emitting elements 21, 22, and 23. The first bonding members 41 of the light-emitting elements 21, 22, and 23 are aligned in the second direction Y. The second bonding members 42 of the light-emitting elements 21, 22, and 23 are aligned in the second direction Y. The third bonding member 43 of the first light-emitting element 21, the fourth bonding member 44 of the second light-emitting element 22, and the fifth bonding member 45 of the third light-emitting element 23 are aligned in the second direction Y.

The first bonding member 41 of the first light-emitting element 21 is bonded to the first interconnect 51. The second bonding member 42 of the first light-emitting element 21 and the first bonding member 41 of the second light-emitting element 22 are bonded to the second interconnect 52. The third bonding member 43 of the first light-emitting element 21, the second and fourth bonding members 42 and 44 of the second light-emitting element 22, and the first bonding member 41 of the third light-emitting element 23 are bonded to the third interconnect 53. The third bonding member 43 of the first light-emitting element 21, the fourth bonding member 44 of the second light-emitting element 22, and the second and fifth bonding members 42 and 45 of the third light-emitting element 23 are bonded to the fourth interconnect 54.

The first light-emitting element 21, the second light-emitting element 22, and the third light-emitting element 23 are connected in series between the first external connection portion 51a of the first interconnect 51 and the fourth external connection portion 54a of the fourth interconnect 54.

Similarly to FIG. 1, the first external connection portion 51a, the second external connection portion 52a, the third external connection portion 53a, and the fourth external connection portion 54a are electrically connected to power supply terminals via conductive members. Any one, two, or all of the first, second, and third light-emitting elements 21, 22, and 23 can be caused to emit light by applying a potential difference between any two external connection portions of the external connection portions 51a, 52a, 53a, and 54a.

Seventh Embodiment

Figure 10:
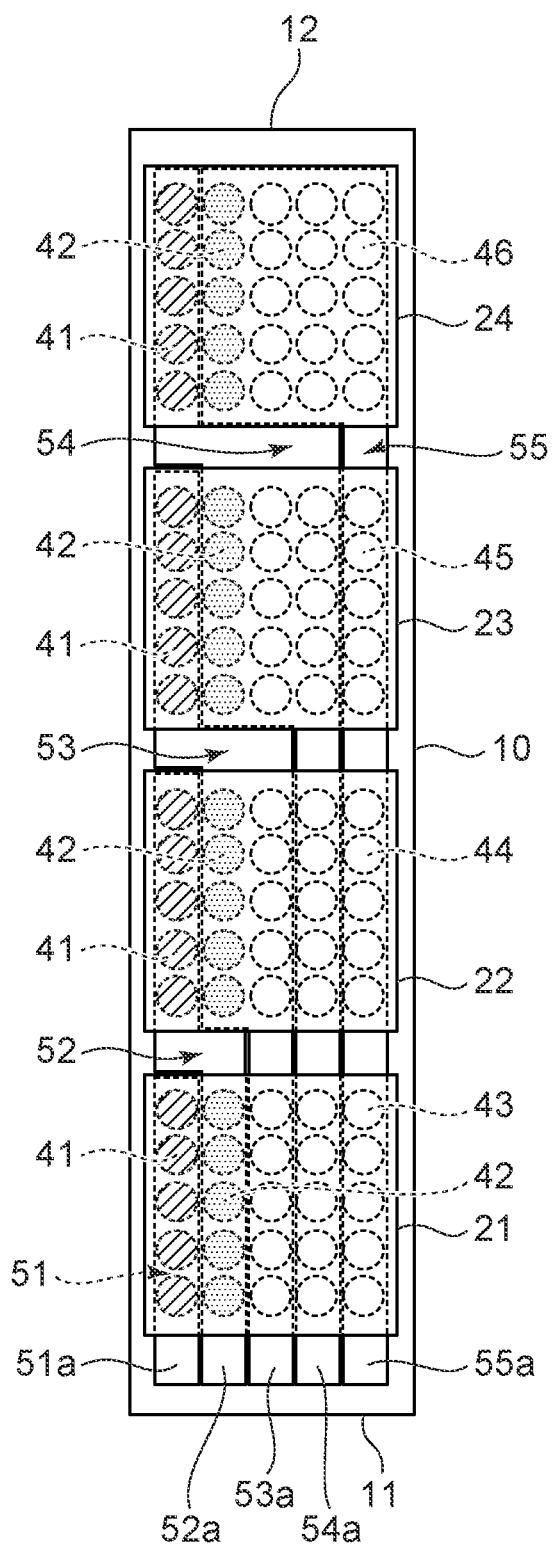
FIG. 10 is a schematic plan view showing a configuration of a light-emitting device of a seventh embodiment of the invention.

FIG. 10 is a schematic plan view showing a configuration of a light-emitting device of a seventh embodiment of the invention. FIG. 10 shows an example in which four light-emitting elements (the first light-emitting element 21, the second light-emitting element 22, the third light-emitting element 23, and a fourth light-emitting element 24) and five interconnects (the first interconnect 51, the second interconnect 52, the third interconnect 53, the fourth interconnect 54, and a fifth interconnect 55) are provided on one substrate 10. Compared to the configuration shown in FIG. 9, the configuration shown in FIG. 10 further includes the fourth light-emitting element 24 and the fifth interconnect 55. Also, compared to the configuration shown in FIG. 9, the third bonding members 43, the fourth bonding members 44, the fifth bonding members 45, and sixth bonding members 46 each are arranged along the second direction Y to form three columns each in the configuration shown in FIG. 10.

The fourth light-emitting element 24 has the same configuration as the first, second, and third light-emitting elements 21, 22, and 23. In a top-view in FIG. 10, the fourth light-emitting element 24 is provided between the third light-emitting element 23 and the second side 12 of the substrate 10.

The fifth interconnect 55 includes a fifth external connection portion 55a. The first external connection portion 51a of the first interconnect 51, the second external connection portion 52a of the second interconnect 52, the third external connection portion 53a of the third interconnect 53, the fourth external connection portion 54a of the fourth interconnect 54, and the fifth external connection portion 55a of the fifth interconnect 55 are located between the first light-emitting element 21 and the first side 11 of the substrate 10.

In the first direction X, the second external connection portion 52a is located between the first external connection portion 51a and the third external connection portion 53a, the third external connection portion 53a is located between the second external connection portion 52a and the fourth external connection portion 54a, and the fourth external connection portion 54a is located between the third external connection portion 53a and the fifth external connection portion 55a.

The fourth light-emitting element 24 also includes the first bonding member 41 electrically connected to the first semiconductor layer 31p, and the second bonding member 42 electrically connected to the second semiconductor layer 31n. The fourth light-emitting element 24 further includes the sixth bonding member 46. The sixth bonding member 46 has the same configuration as the third, fourth, and fifth bonding members 43, 44, and 45, is insulated from the first and second semiconductor layers 31p and 31n, and is in an electrically floating state.

The positions of the bonding members 41, 42, 43, 44, 45, and 46 is the same between the light-emitting elements 21, 22, 23, and 24. The first bonding members 41 of the light-emitting elements 21, 22, 23, and 24 are aligned in the second direction Y. The second bonding members 42 of the light-emitting elements 21, 22, 23, and 24 are aligned in the second direction Y. The third bonding member 43 of the first light-emitting element 21, the fourth bonding member 44 of the second light-emitting element 22, the fifth bonding member 45 of the third light-emitting element 23, and the sixth bonding member 46 of the fourth light-emitting element 24 are aligned in the second direction Y.

The first bonding member 41 of the first light-emitting element is bonded to the first interconnect 51. The second bonding member 42 of the first light-emitting element 21 and the first bonding member 41 of the second light-emitting element 22 are bonded to the second interconnect 52. The third bonding member 43 of the first light-emitting element 21, the second and fourth bonding members 42 and 44 of the second light-emitting element 22, and the first bonding member 41 of the third light-emitting element 23 are bonded to the third interconnect 53. The third bonding member 43 of the first light-emitting element 21, the fourth bonding member 44 of the second light-emitting element 22, the second and fifth bonding members 42 and 45 of the third light-emitting element 23, and the first bonding member 41 of the fourth light-emitting element 24 are bonded to the fourth interconnect 54. The third bonding member 43 of the first light-emitting element 21, the fourth bonding member 44 of the second light-emitting element 22, the fifth bonding member 45 of the third light-emitting element 23, and the second and sixth bonding members 42 and 46 of the fourth light-emitting element 24 are bonded to the fifth interconnect 55.

The first light-emitting element 21, the second light-emitting element 22, the third light-emitting element 23, and the fourth light-emitting element 24 are connected in series between the first external connection portion 51a of the first interconnect 51 and the fifth external connection portion 55a of the fifth interconnect 55.

Similar to FIG. 1, the first external connection portion 51a, the second external connection portion 52a, the third external connection portion 53a, the fourth external connection portion 54a, and the fifth external connection portion 55a are electrically connected to power supply terminals via conductive members. Any one, two, three, or all of the first, second, third, and fourth light-emitting elements 21, 22, 23, and 24 can be caused to emit light by applying a potential difference between any two external connection portions of the external connection portions 51a, 52a, 53a, 54a, and 55a.

Figure 11:
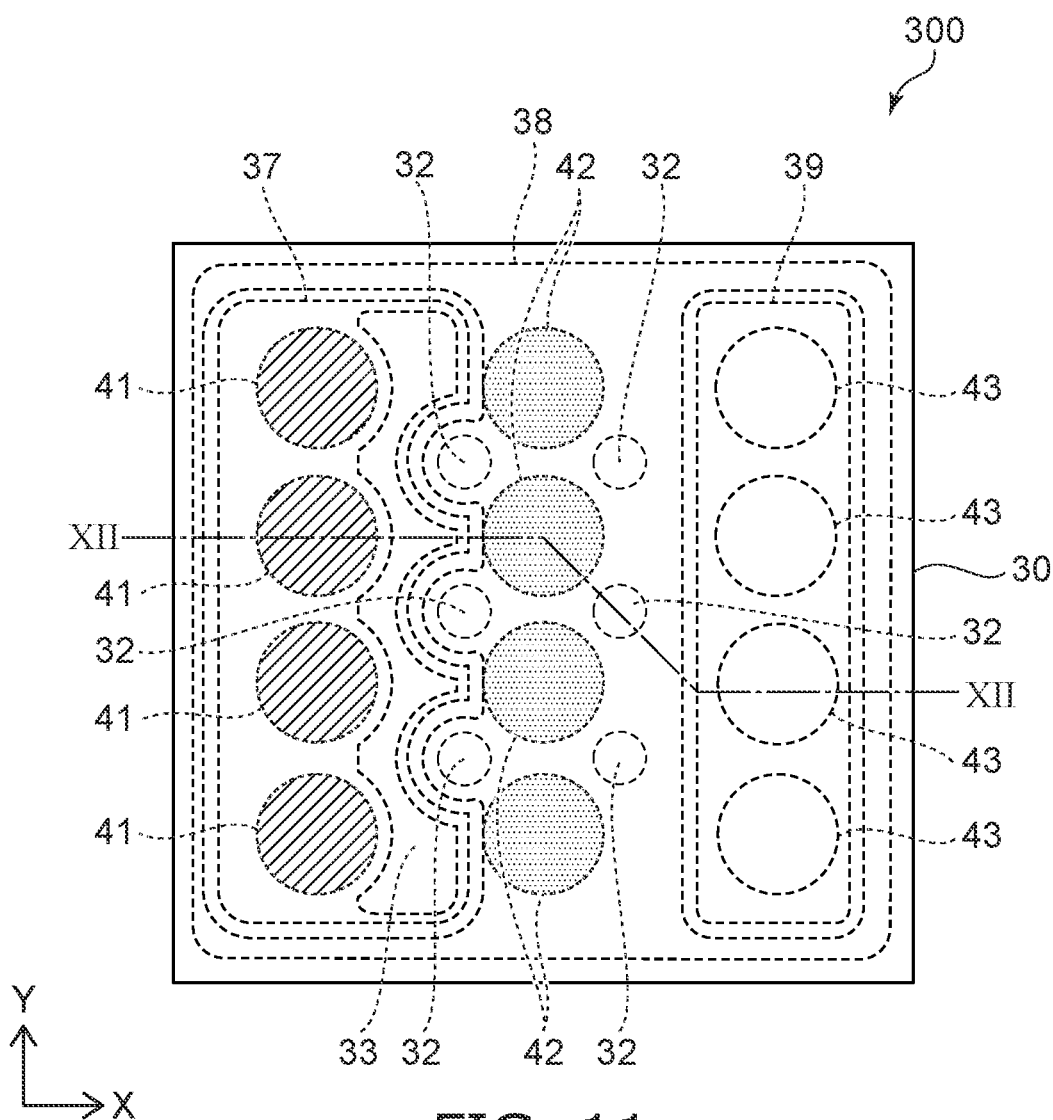
FIG. 11 is a schematic plan view of a light-emitting element of another embodiment of the invention.
Figure 12:
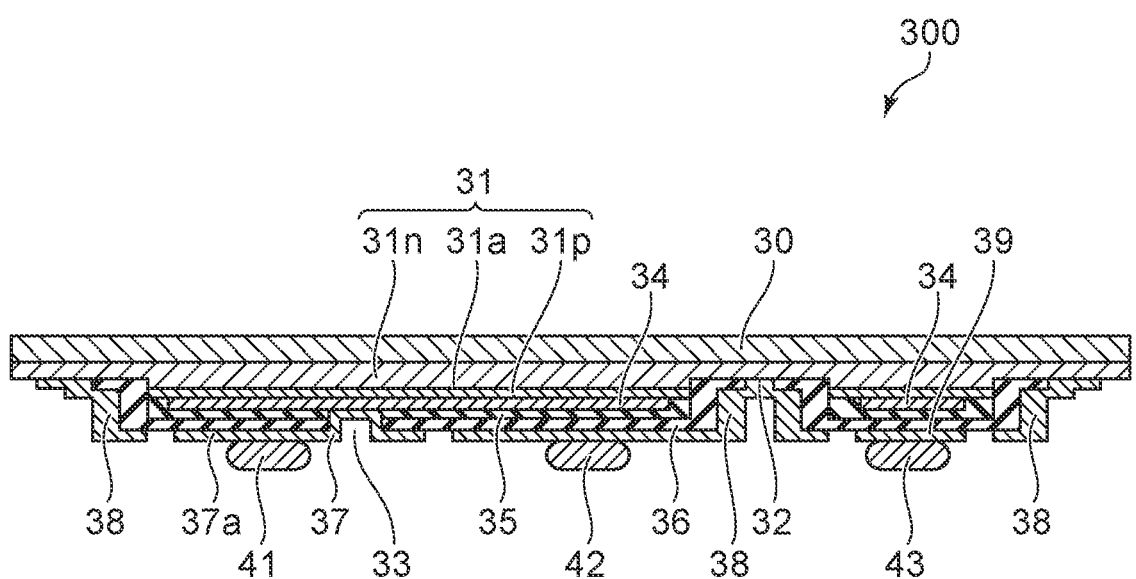
FIG. 12 is a schematic cross-sectional view along line XII-XII of FIG. 11.

Another example of the first light-emitting element 21, the second light-emitting element 22, the third light-emitting element 23, and the fourth light-emitting element 24 will now be described with reference to the drawings. FIG. 11 is a schematic plan view of another light-emitting element 300. FIG. 12 is a schematic cross-sectional view along line XII-XII of FIG. 11.

The arrangement of the first pad electrode 37, the position where the first pad electrode 37 and the reflecting electrode 34 are connected, and the arrangement of the first bonding member 41 of the light-emitting element 300 shown in FIGS. 11 and 12 are mainly different from that of the first light-emitting element 21 shown in FIGS. 3 and 4.

As shown in FIG. 12, an opening 33 is formed in the first insulating film 35 and the second insulating film 36. A portion of the reflecting electrode 34 is exposed in the opening 33. The opening 33 is formed in a region not overlapping a region where the first bonding member 41 is provided. The first pad electrode 37 is connected to the reflecting electrode 34 through the opening 33. The first pad electrode 37 has a covering portion 37a overlapping the first insulating film 35 and the second insulating film 36. The first bonding member 41 is provided on the covering portion 37a. As shown in FIG. 11, in top view, the opening 33 provided in the first insulating film 35 and the second insulating film 36 does not overlap the first bonding member 41.

As shown in FIG. 12, the first bonding member 41, the second bonding member 42, and the third bonding member 43 are provided at substantially the same distance from the support substrate 30. This suppresses the variation in pressure applied to each of the first bonding member 41, the second bonding member 42, and the third bonding member 43 when mounting the light-emitting element 300 on the interconnect provided on the substrate 10. Thus, the light-emitting element can be efficiently mounted on the substrate.

Embodiments of the present invention have been described with reference to specific examples. However, the present invention is not limited to these specific examples. Based on the above-described embodiments of the present disclosure, all embodiments that can be implemented with appropriately design modification by one skilled in the art are also within the scope of the present invention as long as the gist of the present invention is included. Further, within the scope of the spirit of the present invention, one skilled in the art can conceive various modifications, and the modifications fall within the scope of the present invention.

What is claimed is:

1. A light-emitting device, comprising:
a substrate comprising a first side and a second side opposite the first side;
n light-emitting elements (n being a natural number of 2 or more) mounted on the substrate, the n light-emitting elements comprising at least a first light-emitting element and a second light-emitting element, wherein each of the light-emitting elements comprises:
a first semiconductor layer of a first conductivity type,
a second semiconductor layer of a second conductivity type,
a light-emitting layer provided between the first semiconductor layer and the second semiconductor layer,
a first bonding member electrically connected to the first semiconductor layer, and
a second bonding member electrically connected to the second semiconductor layer; and
n+1 interconnects provided on the substrate, the n+1 interconnects comprising a first interconnect comprising a first external connection portion, a second interconnect comprising a second external connection portion, and a third interconnect comprising a third external connection portion;
wherein, in a top-view, the first light-emitting element is located between the first side and the second light-emitting element, and the second light-emitting element is located between the first light-emitting element and the second side;
wherein, in a top-view, the first external connection portion, the second external connection portion, and the third external connection portion are located between the first side and the first light-emitting element;
the first bonding member of the first light-emitting element is bonded to the first interconnect;
the second bonding member of the first light-emitting element and the first bonding member of the second light-emitting element are bonded to the second interconnect; and
the second bonding member of the second light-emitting element is bonded to the third interconnect.

2. The device according to claim 1, wherein:
positions of the first and second bonding members in the first light-emitting element are the same as positions of the first and second bonding members in the second light-emitting element.

3. The device according to claim 2, wherein:
the first and second sides of the substrate extend along a first direction,
the first bonding member of the first light-emitting element and the first bonding member of the second light-emitting element are aligned in a second direction that is orthogonal to the first direction, and
the second bonding member of the first light-emitting element and the second bonding member of the second light-emitting element are aligned in the second direction.

4. The device according to claim 3, wherein:
the second interconnect comprises:
a first portion extending in the second direction, the first portion being bonded to the second bonding member of the first light-emitting element,
a second portion extending in the first direction from the first portion, and
a third portion extending in the second direction from the second portion, the third portion being bonded to the first bonding member of the second light-emitting element.

5. The device according to claim 4, wherein:
the second portion of the second interconnect is positioned between the first light-emitting element and the second light-emitting element.

6. The device according to claim 3, wherein:
the first light-emitting element further comprises a third bonding member insulated from the first and second semiconductor layers and bonded to at least the third interconnect, and
the second light-emitting element further comprises a fourth bonding member insulated from the first and second semiconductor layers and bonded to at least the third interconnect.

7. The device according to claim 4, wherein:
the first light-emitting element further comprises a third bonding member insulated from the first and second semiconductor layers and bonded to at least the third interconnect, and
the second light-emitting element further comprises a fourth bonding member insulated from the first and second semiconductor layers and bonded to at least the third interconnect.

8. The device according to claim 6, wherein:
a position of the third bonding member in the first light-emitting element is the same as a position of the fourth bonding member in the second light-emitting element.

9. The device according to claim 7, wherein:
a position of the third bonding member in the first light-emitting element is the same as a position of the fourth bonding member in the second light-emitting element.

10. The device according to claim 1, wherein:
the first and second sides of the substrate extend along a first direction, and
the second external connection portion is located between the first external connection portion and the third external connection portion in the first direction.

11. The device according to claim 2, wherein:
the first and second sides of the substrate extend along a first direction, and
the second external connection portion is located between the first external connection portion and the third external connection portion in the first direction.

12. The device according to claim 3, wherein:
the first and second sides of the substrate extend along a first direction, and
the second external connection portion is located between the first external connection portion and the third external connection portion in the first direction.

13. The device according to claim 6, wherein:
the third interconnect comprises:
   a first portion extending in the second direction, the first portion being bonded to the third bonding member of the first light-emitting element; and
   a second portion extending in the first direction from the first portion, the second portion being bonded to the second and fourth bonding members of the second light-emitting element.

14. The device according to claim 7, wherein:
the third interconnect comprises:
   a first portion extending in the second direction, the first portion being bonded to the third bonding member of the first light-emitting element; and
   a second portion extending in the first direction from the first portion, the second portion being bonded to the second and fourth bonding members of the second light-emitting element.

15. The device according to claim 8, wherein:
the third interconnect comprises:
   a first portion extending in the second direction, the first portion being bonded to the third bonding member of the first light-emitting element; and
   a second portion extending in the first direction from the first portion, the second portion being bonded to the second and fourth bonding members of the second light-emitting element.

16. The device according to claim 9, wherein:
the third interconnect comprises:
   a first portion extending in the second direction, the first portion being bonded to the third bonding member of the first light-emitting element; and
   a second portion extending in the first direction from the first portion, the second portion being bonded to the second and fourth bonding members of the second light-emitting element.

* * * * *